United States Patent
Zhou

(10) Patent No.: US 9,356,003 B1
(45) Date of Patent: May 31, 2016

(54) HIGHLY INTEGRATED FLEX SENSOR PACKAGE

(71) Applicant: Maxim Integrated Products, Inc., San Jose, CA (US)

(72) Inventor: Tiao Zhou, Carrollton, TX (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/231,979

(22) Filed: Apr. 1, 2014

Related U.S. Application Data

(60) Provisional application No. 61/907,436, filed on Nov. 22, 2013.

(51) Int. Cl.
*H01L 25/07* (2006.01)
*H01L 23/00* (2006.01)
*H01L 29/84* (2006.01)

(52) U.S. Cl.
CPC .............. *H01L 25/074* (2013.01); *H01L 24/83* (2013.01); *H01L 25/072* (2013.01); *H01L 29/84* (2013.01)

(58) Field of Classification Search
CPC ....... H01L 25/072; H01L 24/83; H01L 29/84; H01L 25/071; H01L 25/074
See application file for complete search history.

(56) References Cited

U.S. PATENT DOCUMENTS

| | | | | |
|---|---|---|---|---|
| 2007/0146534 | A1* | 6/2007 | Kim et al. | 348/340 |
| 2007/0217786 | A1* | 9/2007 | Cho et al. | 396/542 |
| 2008/0291316 | A1* | 11/2008 | Cheng | H01L 25/16 348/340 |
| 2009/0166831 | A1* | 7/2009 | Chang et al. | 257/680 |
| 2013/0270419 | A1* | 10/2013 | Singh et al. | 250/208.1 |

* cited by examiner

*Primary Examiner* — Michele Fan
(74) *Attorney, Agent, or Firm* — Advent, LLP

(57) ABSTRACT

Packaging techniques are described for fabricating a flex sensor package that includes a flex printed circuit with a flex window, an adhesive layer with an adhesive layer window, and a stiffener assembly with a stiffener window on a first side of the flex printed circuit and a semiconductor die on a second side of the flex printed circuit. In implementations, fabricating the flex sensor package includes receiving a flex printed circuit including at least one flex window, placing an adhesive layer on at least a portion of a first side of the flex printed circuit, placing a stiffener assembly on the adhesive layer, and placing at least one semiconductor die on a second side of the flex printed circuit, where an active portion of the at least one semiconductor die is aligned with the at least one flex window and the adhesive layer window.

9 Claims, 4 Drawing Sheets

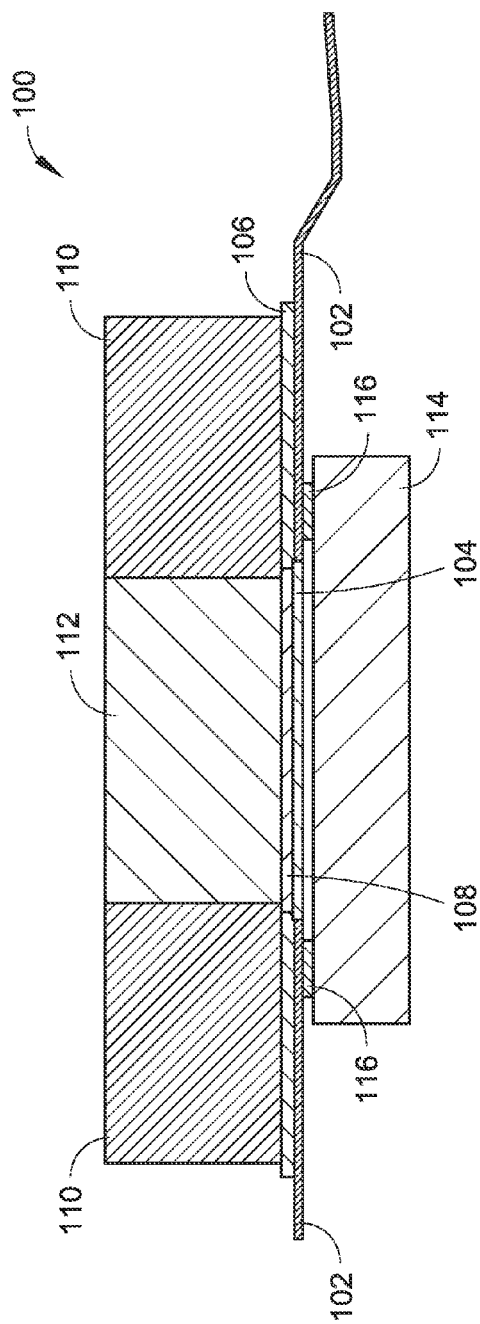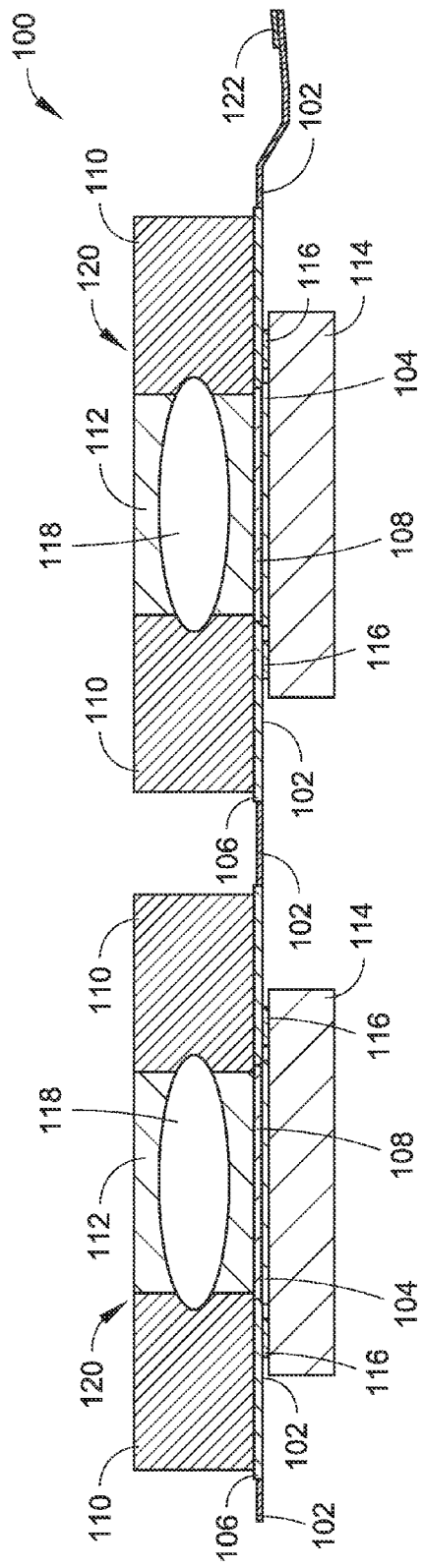
FIG. 1A
FIG. 1B

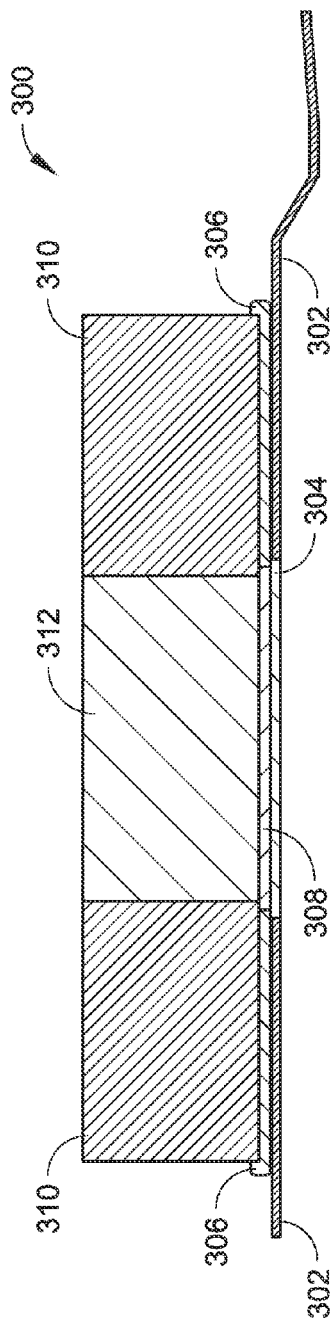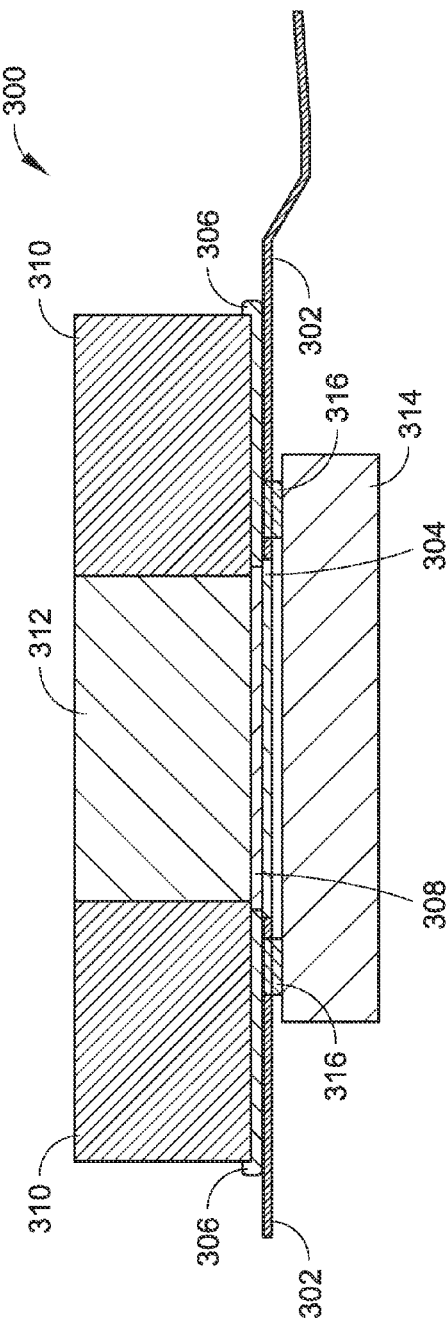

US 9,356,003 B1

HIGHLY INTEGRATED FLEX SENSOR PACKAGE

CROSS-REFERENCE TO RELATED APPLICATIONS

The present application claims the benefit under 35 U.S.C. §119(e) of U.S. Provisional Application Ser. No. 61/907,436, filed Nov. 22, 2013, and titled "HIGHLY INTEGRATED FLEX SENSOR PACKAGE." U.S. Provisional Application Ser. No. 61/907,436 is herein incorporated by reference in its entirety.

BACKGROUND

Electronic devices, such as smart phones, tablet computers, digital media players, and so forth, increasingly employ sensors to control the manipulation of a variety of functions provided by the device. For example, optical sensors are commonly used by electronic devices to detect ambient lighting conditions in order to control the brightness of the device's display screen. Similarly, optical sensors are commonly used in proximity and gesture sensing applications. Proximity and gesture sensing enables the detection of physical movement (e.g., "gestures") without the user actually touching the device within which the sensing device resides. The detected movements can be subsequently used as input commands for the device.

SUMMARY

In implementations, packaging techniques are described for fabricating a flex sensor package that includes a flex printed circuit with a flex window, an adhesive layer with an adhesive layer window, and a stiffener assembly with a stiffener window on a first side of the flex printed circuit and a semiconductor die on a second side of the flex printed circuit. In implementations, an electronic device includes a printed circuit board and a flex sensor package coupled to the printed circuit board, where the flex sensor package includes a flex printed circuit with a flex window, an adhesive layer with an adhesive layer window, and a stiffener assembly with a stiffener window on a first side of the flex printed circuit and a semiconductor die on a second side of the flex printed circuit. In implementations, fabricating the flex sensor package includes receiving a flex printed circuit including at least one flex window, placing an adhesive layer on at least a portion of a first side of the flex printed circuit, placing a stiffener assembly on the adhesive layer, and placing at least one semiconductor die on a second side of the flex printed circuit, where an active portion of the at least one semiconductor die is aligned with the at least one flex window and the adhesive layer window.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

FIG. 1A is a diagrammatic partial cross-sectional side elevation view illustrating a flex sensor package in accordance with example implementations of the present disclosure.

FIG. 1B is a diagrammatic partial cross-sectional side elevation view illustrating a flex sensor package in accordance with example implementations of the present disclosure.

FIG. 3C is a diagrammatic partial cross-sectional side elevation view illustrating the fabrication of a sensor package, such as the flex sensor package shown in FIGS. 1A through 1B, in accordance with the process shown in FIG. 2.

FIG. 3D is a diagrammatic partial cross-sectional side elevation view illustrating the fabrication of a sensor package, such as the flex sensor package shown in FIGS. 1A through 1B, in accordance with the process shown in FIG. 2.

DETAILED DESCRIPTION

Overview

Figure 2:
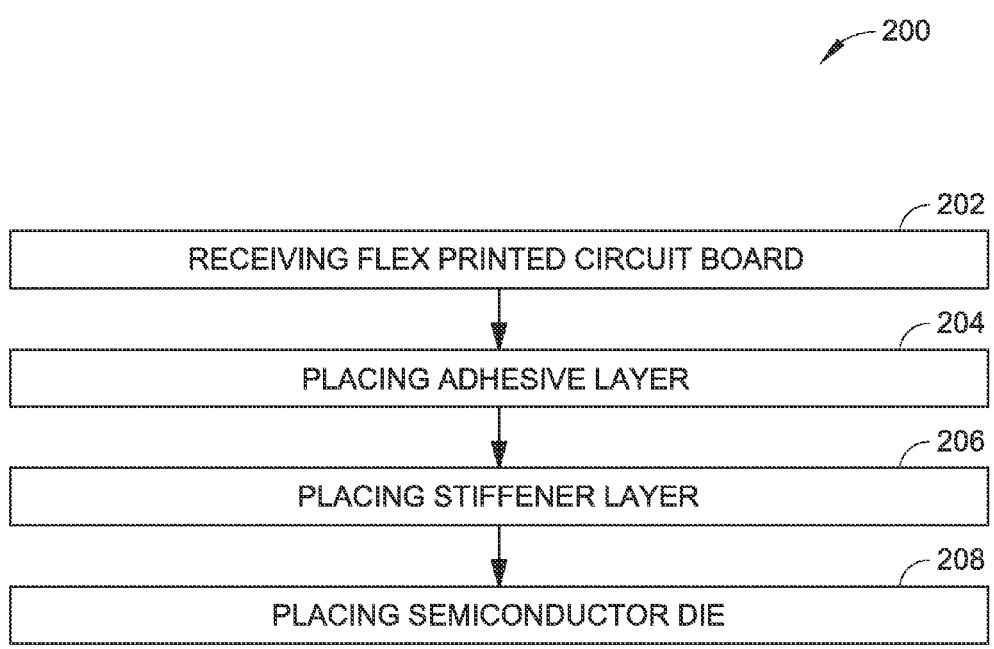
FIG. 2 is a flow diagram illustrating a process in an example implementation for fabricating sensor packages, such as the flex sensor package shown in FIGS. 1A through 1B.

Current packaging solutions for sensors and other electronic components are very complex with complicated package constructions, significant tooling costs, and marginal reliability. Current methods and materials relating to sensor devices can be expensive and difficult to integrate into a typical electronic package construction without significantly increasing the complexity of the assembly process as well as a significant increase in tooling charges associated with the assembly technology. Additionally, many sensor packages have a large footprint.

Accordingly, packaging techniques are described for fabricating a flex sensor package that includes a flex printed circuit with a flex window, an adhesive layer with an adhesive layer window, and a stiffener assembly with a stiffener window on a first side of the flex printed circuit and a semiconductor die on a second side of the flex printed circuit. In implementations, an electronic device includes a printed circuit board and a flex sensor package coupled to the printed circuit board, where the flex sensor package includes a flex printed circuit with a flex window, an adhesive layer with an adhesive layer window, and a stiffener assembly with a stiffener window on a first side of the flex printed circuit and a semiconductor die on a second side of the flex printed circuit. In implementations, fabricating the flex sensor package includes receiving a flex printed circuit including at least one flex window, placing an adhesive layer on at least a portion of a first side of the flex printed circuit, placing a stiffener assembly on the adhesive layer, and placing at least one semiconductor die on a second side of the flex printed circuit, where an active portion of the at least one semiconductor die is aligned with the at least one flex window and the adhesive layer window.

Example Implementations

FIGS. 1A through 1B illustrate a flex sensor package 100 in accordance with example implementations of the present disclosure. As shown, the flex sensor package 100 includes a flex printed circuit 102. In implementations, the flex printed circuit 102 can include flexible plastic substrates (e.g., polyimide, polyether ether ketone (PEEK) or a transparent conductive polyester film). In some embodiments, a flex printed circuit 102 can include screen printed silver circuits on polyester. Flex printed circuits 102 may be manufactured using similar components used for a rigid printed circuit board allowing the board to conform to a desired shape or to flex during its use. Additionally flex printed circuits 102 may be made with photolithography technologies. Other embodiments for fabricating flex printed circuits 102 can include laminating very thin (e.g., 0.07 mm) copper strips between two layers of a polymer (e.g., polyethylene terephthalate). These polymer layers, often about 0.05 mm thick, may be coated with a thermosetting adhesive that can be activated during a lamination process. In implementation, the flex printed circuits 102 can include a flex window 104. A flex window 104 can include a cavity and/or a void created in the flex printed circuit 102 during fabrication. In some embodiments, the flex window 104 can be created using a punch and/or laser-cutting, for example.

The flex sensor package 100 includes an adhesive layer 106. In various embodiments, the adhesive layer 106 can include a transparent epoxy, a thin film, or a transparent adhesive film (e.g., an epoxy or film that can be at least substantially transparent (although not required) to electromagnetic radiation having the wavelength or spectrum of wavelengths desired to be emitted and/or received by the semiconductor die 114). The adhesive layer 106 may include a layer of material with a high surface-to-volume ratio that may be deposited on the flex printed circuit 102 by lamination, printing, thermal growing, or vapor deposition, for example. Further, the adhesive layer 106 can include an adhesive layer window 108 formed in the adhesive layer 106. In implementations, the adhesive layer window 108 may include a cavity, a void, or a portion of the flex printed circuit 102 where no adhesive layer 106 is deposited and/or placed. The adhesive layer window 108 can be aligned with the flex window 104 so that electromagnetic radiation can transmitted to and/or from a semiconductor die 114.

The flex sensor package 100 includes a stiffener assembly 110. In implementations, the stiffener assembly 110 can include a layer of material configured to structurally and environmentally protect the semiconductor die 114 and/or the flex printed circuit 102, where the stiffener assembly 110 is coupled to the adhesive layer 106. In embodiments, the stiffener assembly 110 may include a silicon layer (e.g., a portion of a silicon wafer). In other embodiments, the stiffener layer 118 may include a metal and/or an alloy, glass, a plastic, etc. In some specific implementations, the stiffener assembly 110 includes a stiffener window 112. In one specific embodiment, the stiffener window 112 can include a cavity and/or an open space in which electromagnetic radiation can pass and/or be transmitted to and/or from a semiconductor die 114. In another specific embodiment, the stiffener window 112 can include an optically-transparent material, such as a substantially clear epoxy, glass, and/or polymer. In some specific embodiments and as shown in FIG. 1B, the stiffener assembly 110 and/or stiffener window 112 can include a lens assembly 120, which can further include a lens 118 and the stiffener assembly 110. As shown in FIG. 1B, the flex sensor package 100 may include more than one stiffener assembly 110 where each stiffener assembly 110 corresponds with a semiconductor die 114 and corresponding flex window(s) 104 and adhesive layer window(s) 108.

As illustrated in FIGS. 1A and 1B, the flex sensor assembly 100 includes a semiconductor die 114 coupled to the flex printed circuit 102. In some embodiments, a semiconductor die 114 can include an integrated circuit chip with integrated circuits formed therein. In additional embodiments, the semiconductor die 114 can include passive devices (e.g., an inductor, a capacitor, and/or a resistor). In yet other embodiments, a semiconductor die 114 can include a sensor, such as an optical sensor (e.g., photodetectors such as phototransistors or photodiodes, and so forth), a pressure sensor, a heat sensor, a radiation sensor, and/or a chemical sensor. Further, the semiconductor die 114 can include an emitter and/or light sources (e.g., a light emitting device, such as an LED). Other types of electrical components may also be utilized (e.g., chemical sensors, bio-sensors, combinations thereof, etc.). In one specific embodiment, the flex sensor assembly 100 includes a semiconductor die 114 having a display that can show information through the stiffener window 112. In additional examples, the semiconductor die 114 can include a processor and/or an emitter.

In some implementations, the semiconductor die 114 is coupled to the flex printed circuit 102 using at least one solder bump 116. Solder bumps 116 can be formed on the semiconductor die 114. Solder bumps 116 can be provided to furnish mechanical and/or electrical interconnection between the semiconductor die 114 and the flex printed circuit 102. In one or more implementations, the solder bumps 116 may be fabricated of a lead-free solder such as a Tin-Silver-Copper (Sn—Ag—Cu) alloy solder (i.e., SAC), a Tin-Silver (Sn—Ag) alloy solder, a Tin-Copper (Sn—Cu) alloy solder, and so on. The solder bumps 116 may be configured to subsequently reflowed and further secured to the flex printed circuit 102.

In some implementations and as illustrated in FIG. 1B, the flex sensor package 100 can include an interconnect, such as an edge connector 122. An edge connector 122 may include a portion of the flex printed circuit 102 and/or a printed circuit board (PCB) including traces leading to the edge of the flex printed circuit 102 that are intended to plug into a matching socket. In one specific embodiment, an edge connector 122 can include a zero insertion force (ZIF) edge connector.

Other materials and components may be included in this implementation to finalize the flex sensor package 100 (e.g., addition of other interconnects, other solder bumps, additional electronic components, etc.).

Example Fabrication Processes

FIG. 2 illustrates an example process 200 that employs sensor packaging techniques to fabricate flex sensor packages, such as the flex sensor package 100 shown in FIGS. 1A through 1B. FIGS. 3A through 3D illustrate sections 300 of an example flex sensor package that are utilized to fabricate sensor devices (such as the flex sensor package 100 shown in FIGS. 1A through 1B).

Figure 3A:
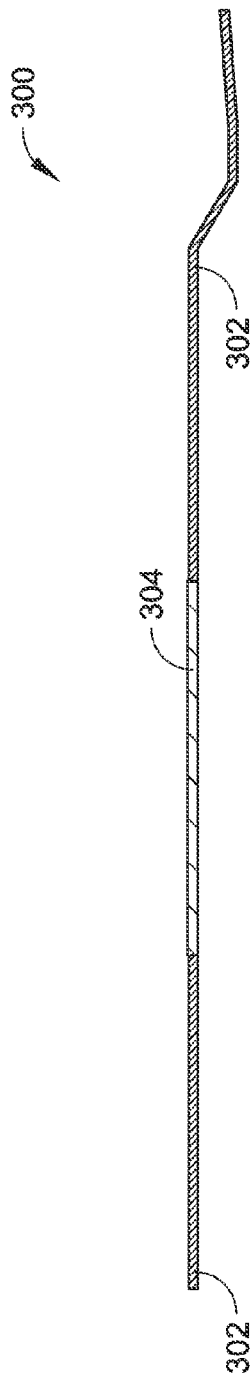
FIG. 3A is a diagrammatic partial cross-sectional side elevation view illustrating the fabrication of a sensor package, such as the flex sensor package shown in FIGS. 1A through 1B, in accordance with the process shown in FIG. 2.

As shown in FIG. 2, a flex printed circuit including at least one flex window is received (Block 202). FIG. 3A illustrates a portion of the flex printed circuit 302 having at least one flex window 304. In implementations, receiving the flex printed circuit may include receiving a pre-fabricated flex printed circuit. A flex printed circuit 302 may include flexible plastic substrates (e.g., polyimide, polyether ether ketone (PEEK) or a transparent conductive polyester film) having metal lines or other circuits printed and/or formed therein.

Figure 3B:
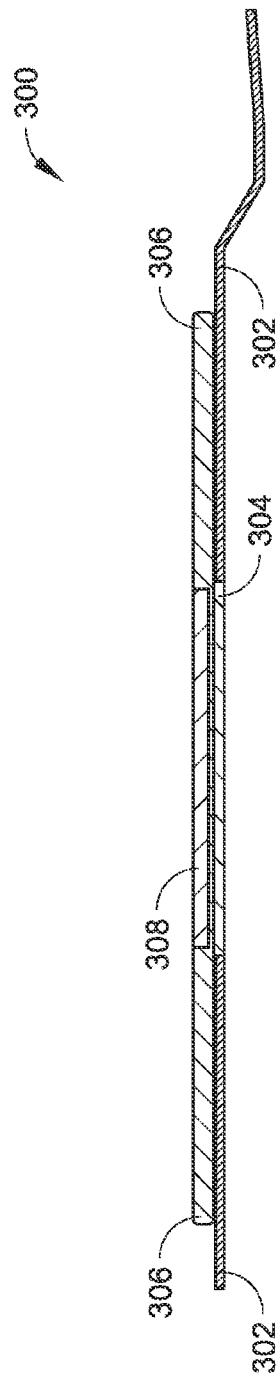
FIG. 3B is a diagrammatic partial cross-sectional side elevation view illustrating the fabrication of a sensor package, such as the flex sensor package shown in FIGS. 1A through 1B, in accordance with the process shown in FIG. 2.

Next, an adhesive layer is placed on at least a portion of a first side of the flex printed circuit (Block 204). FIG. 3B illustrates one example of placing an adhesive layer 306 on one side of the flex printed circuit 302. In implementations, placing the adhesive layer 306 on one side of the flex printed circuit 302 includes placing an adhesive layer 306 with an adhesive layer window 308. In implementations, the adhesive layer window 308 may include a cavity, a void, or a portion of the flex printed circuit 302 where no adhesive layer 306 is deposited and/or placed. Additionally, placing the adhesive layer 306 can include processes such as deposition or printing.

Then, a stiffener assembly is placed on the adhesive layer (Block 206). In some implementations, placing a stiffener assembly 310 includes using pick-and place technology to place a preassembled stiffener assembly 310. In other implementations, placing the stiffener assembly 310 can include using deposition and/or printing techniques, such as printing different layers. Placing the stiffener assembly 310 using printing techniques can include, for example, printing layers of the stiffener assembly 310. Additionally, placing a stiffener assembly 310 can include placing a stiffener assembly 310 including a lens assembly 320 and/or a lens 318.

A semiconductor die is then placed on a second side of the flex printed circuit (Block 208). In implementations, placing a semiconductor die 314 on a second side of the flex printed circuit 302 can include using at least one solder bump 318 to reflow and attach the semiconductor die 314 to the flex printed circuit 302. In implementations, placing and/or forming at least one solder bump 318 includes forming an array of solder bumps 318 on one side of the semiconductor die 314. In some embodiments, the solder bump(s) 318 may be held to the semiconductor die 314, for example by flux, until the flex sensor package 100 and/or semiconductor die 314 is subjected to a suitable reflow process. The solder bump(s) 318 may then be reflowed.

It is contemplated that further semiconductor fabrication techniques may be utilized to finalize the flex sensor package 100 fabrication process. For instance, attaching additional devices to the flex printed circuit 102 may be incorporated.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A flex sensor package, comprising:
   a flex printed circuit including at least one flex window formed therein, where the flex printed circuit comprises a zero initiation force edge connector;
   an adhesive layer disposed on a portion of a first side of the flex printed circuit;
   at least one stiffener assembly disposed on the adhesive layer, where the at least one stiffener assembly includes a stiffener window including an optically-transparent material formed therein;
   at least one semiconductor die disposed on a second side of the flex printed circuit, where an active portion of at least one semiconductor die is aligned with at least one flex window and at least one stiffener window.

2. The flex sensor package in claim 1, where the at least one stiffener assembly includes a lens assembly.

3. The flex sensor package in claim 1, where the at least one semiconductor die includes a sensor die.

4. The flex sensor package in claim 3, where the sensor die includes an optical sensor, a chemical sensor, a radiation sensor, a heat sensor, or a pressure sensor.

5. The flex sensor package in claim 1, further comprising at least one solder bump.

6. An electronic device, comprising:
   a printed circuit board; and
   a flex sensor package including
      a flex printed circuit including at least one flex window formed therein, where the flex printed circuit comprises a zero initiation force edge connector;
      an adhesive layer disposed on a portion of a first side of the flex printed circuit;
      at least one stiffener assembly disposed on the adhesive layer, where the at least one stiffener assembly includes a stiffener window including an optically-transparent material formed therein; and
      at least one semiconductor die disposed on a second side of the flex printed circuit, where an active portion of at least one semiconductor die is aligned with at least one flex window and at least one stiffener window.

7. The electronic device in claim 6, where the at least one stiffener assembly includes a lens assembly.

8. The electronic device in claim 6, where the at least one semiconductor die includes a sensor die.

9. The electronic device in claim 8, where the sensor die includes an optical sensor, a chemical sensor, a radiation sensor, a heat sensor, or a pressure sensor.

* * * * *